US005679027A

United States Patent [19]
Smith

[11] Patent Number: 5,679,027
[45] Date of Patent: Oct. 21, 1997

[54] APPARATUS FOR CROSSTALK CANCELLATION IN DATA CONNECTORS

[75] Inventor: Robert James Edward Smith, Nottingham, England

[73] Assignee: Pressac Ltd., Nottingham, Great Britain

[21] Appl. No.: 393,005

[22] PCT Filed: Aug. 31, 1993

[86] PCT No.: PCT/GB93/01840

§ 371 Date: May 3, 1995

§ 102(e) Date: May 3, 1995

[87] PCT Pub. No.: WO94/06216

PCT Pub. Date: Mar. 17, 1994

[30] Foreign Application Priority Data

Sep. 4, 1992 [GB] United Kingdom ............ 9218724

[51] Int. Cl.$^6$ ............................................. H01R 23/02
[52] U.S. Cl. ........................................ 439/676; 439/941
[58] Field of Search .................................... 439/676, 941

[56] References Cited

U.S. PATENT DOCUMENTS

| | | |
|---|---|---|
| 5,226,835 | 7/1993 | Baker, III et al. ............ 439/941 X |
| 5,282,754 | 2/1994 | Kish et al. .................. 439/941 X |
| 5,299,956 | 4/1994 | Brownell et al. . |
| 5,310,363 | 5/1994 | Brownell et al. . |
| 5,399,107 | 3/1995 | Gentry et al. . |
| 5,414,393 | 5/1995 | Rose et al. . |
| 5,454,738 | 10/1995 | Lim et al. .................... 439/676 OR |

FOREIGN PATENT DOCUMENTS

| | | |
|---|---|---|
| 0 421 174 A3 | 4/1991 | European Pat. Off. . |
| 0 525 703 A1 | 2/1993 | European Pat. Off. . |
| 3145039A1 | 9/1992 | Germany . |
| 659558 A5 | 1/1987 | Switzerland . |
| 2269941 | 2/1994 | United Kingdom . |
| WO 93/19500 | 9/1993 | WIPO . |

*Primary Examiner*—P. Austin Bradley
*Assistant Examiner*—Daniel Wittels
*Attorney, Agent, or Firm*—Finnegan, Henderson, Farabow, Garrett & Dunner

[57] ABSTRACT

The invention provides a means of reducing crosstalk in data connectors and includes a first conductive signal path and a second conductive signal path. The first signal path includes crossover connection means for changing over the position of the first signal path at a point intermediate between the ends of the first and second paths to reduce crosstalk in the first and second paths through the introduction of antiphase signals. In practice this antiphase crosstalk can be applied by a network of PCB tracks (36) to simulate the conductors.

3 Claims, 3 Drawing Sheets

5,679,027

APPARATUS FOR CROSSTALK CANCELLATION IN DATA CONNECTORS

BACKGROUND OF THE INVENTION a) Field of the Invention

The present application relates to a method and apparatus for cross talk cancellation and is particularly applicable to cancellation of cross talk in communications systems for data transmission.

b) Description of the Prior Art

In a typical data communication system, data and voice signals are passed along unshielded twisted pair (UTP) cables. In a typical cable system a plurality of twisted pairs are enclosed in a single cable. Such cables have, however, to be interconnected with, for example, peripheral equipment such as digital telephones, facsimile machines, etc. by means of plugs and jacks.

Thus the speed at which data is being passed along UTP cables is increasing all the time. It is therefore important that the connecting hardware (plugs and jacks) have at least equal transmission performance to that of the UTP otherwise the performance characteristic of any overall system may be compromised.

SUMMARY OF THE INVENTION

It is therefore an object of the present invention to provide a method and apparatus for reducing cross talk in communication systems.

It is a further object to provide a jack socket incorporating apparatus for reducing cross talk on communication systems.

The present invention therefore provides a method of reducing cross talk in data communication systems in which an electrical signal is coupled onto a first signal path including generating an antiphase electrical signal in a second signal path and adding the antiphase signal to the electrical signal in the first signal path to cancel cross talk present on the first signal path.

The present invention also provides apparatus for reducing cross talk in data communication systems including a first conductive signal path and a second conductive signal path said first signal path including cross over connection means for changing over the position of the conductor of the first signal path at a point intermediate between the ends of the first and second conductive signal paths to reduce cross talk in the first and second conductive signal paths.

BRIEF DESCRIPTION OF THE DRAWINGS

Embodiments of the present invention will now be described, by way of example, with reference to the accompanying drawings in which.

DESCRIPTION OF THE EMBODIMENTS

Figure 1:
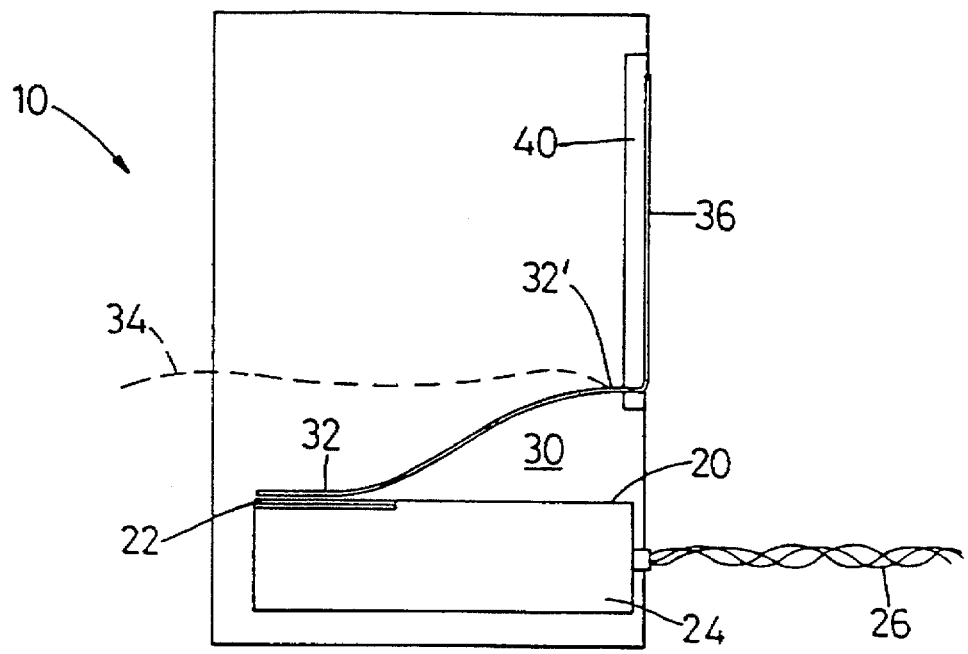
FIG. 1 shows diagrammatically in side elevational cross section an eight way connecting system comprising a plug and jack socket illustrative of an embodiment of the present invention.
Figure 2:
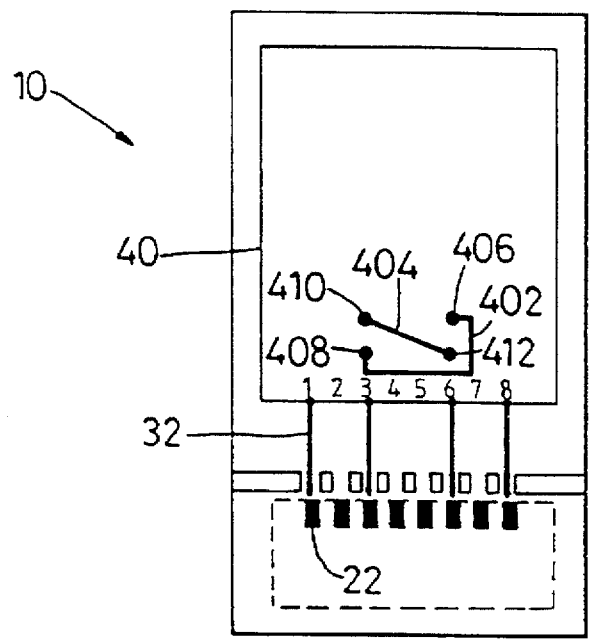
FIG. 2 shows the plug and socket of FIG. 1 in schematic rear elevation.
Figure 3:
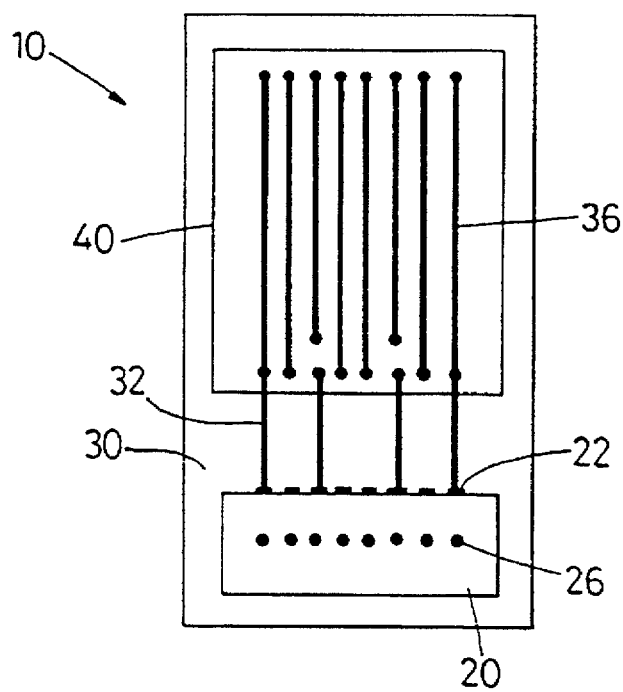
FIG. 3 shows the plug and socket of FIG. 1 in schematic front elevation.

With reference now to FIGS. 1 to 3, a plug and jack socket arrangement 10 is shown comprising a plug 20 and a jack socket 30.

The plug comprises an eight contact system comprising individual connector contacts 22 in a body of plastics material 24. Each contact 22 is connected to one wire of an unshielded twisted pair (UTP) cable shown diagrammatically at 26. The cable 26 connects, for example, to an item of electrical equipment such as a facsimile machine, digital telephone, etc.

The plug 20 fits in a known manner within the socket 30 which comprises a plurality of contacts 32 which contact with the respective connector contacts 22. Only four contacts 32 are shown in FIGS. 2 and 3 for clarity.

In a known jack socket arrangement wires would be connected directly to the opposite ends 32' of the contacts 32. These wires are illustrated as dotted lines 34. These wires 34 would, in a normal arrangement, be connected to the data communication system, the jack and socket thereby connecting an item of electronic equipment to the communication system.

In accordance with the present invention however the contacts 32 are not connected directly to the communication system as explained hereafter.

As hereinbefore described, the connecting hardware exemplified is the 8-way Western Electric or American WECO RJ45 connecting system of plugs and jacks. The object of the present invention is to reduce the cross talk, also referred to as cancellation of cross talk. According to Technical Systems Bulletin TIA PN-2948 there are three categories of UTP connecting hardware, category 5 being the most stringent where the performance of the connector is measured at frequencies up to 100 MHz. One of the most crucial and difficult performance characteristics to meet is the near end cross talk loss. This is a measure of signal coupling from one circuit or pair of wires to another within a connector. The present invention in particular seeks to cancel this cross talk loss.

Figure 4:
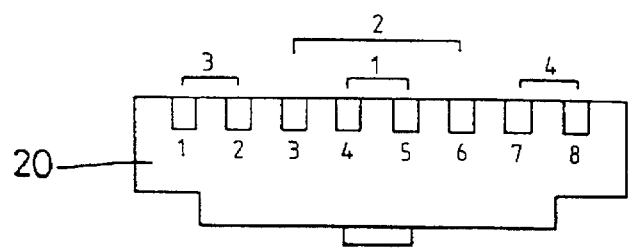
FIG. 4 shows the arrangement of pairs of wires in an 8-way Western Electric or American WECO RJ45 connection system of the type shown in FIGS. 1 to 3.

With reference to FIG. 4, the pairs of wires in an RJ45 connector are arranged as shown.

As can be seen, the conductors in the plug 20 are arranged such that pair 1 (wires 4 and 5) are in between pair 2 (wires 3 and 6). In both the wires 26 of the plug and the fingers 32 of the jacks, the conductors are parallel to each other and reasonably close together as illustrated in FIG. 2. This means a mutual capacitance exists between the conductors and more importantly, a medium exists to allow signals to be conducted across from conductor to conductor.

Figure 5:
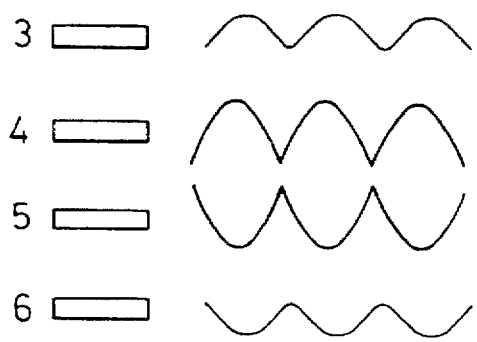
FIG. 5 illustrates theoretically the principle of the present invention.

For example, with reference to FIG. 5, considering pairs 1 and 2 these are connected to wires 4 and 5, and 3 and 6, respectively. The figure illustrates the generation of cross talk and shows on wires 4 and 5 a typical transmitted signal and on wires 3 and 6 a cross talk signal which is a proportion of the signal from pair 1 (wires 4 and 5) transferred to pair 2 (wires 3 and 6) due to the mutual capacitance of the conductors.

The mount of signal passed across to the adjacent conductors is dependent on the capacitance between the conductors. This capacitance is affected by many variables. The greater the capacitance between conductors the worse the cross talk becomes.

Figure 6:
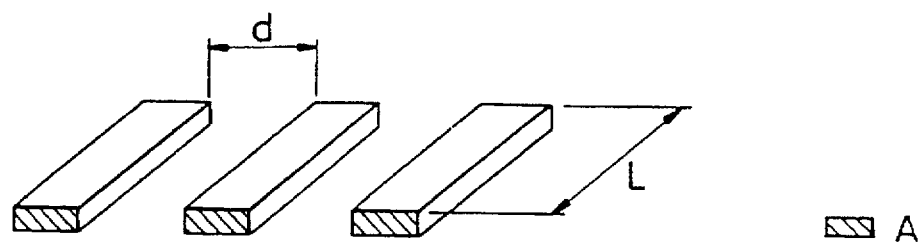
FIG. 6 illustrates the principles of cancellation of cross talk in accordance with the present invention using parallel conductive paths on a printed circuit.

FIG. 6 represents diagrammatically three of the fingers of an eight way socket.

The cross talk can be reduced to a certain level by reducing cross sectional area A, reducing distance L and increasing distance d.

Unfortunately most of these variables can only be changed to a limited extent because of the physical design constraints of the socket, therefore, another solution is required for cancellation of cross talk.

The solution to the problem, in accordance with the present invention, is to apply an equal and opposite amount of cross talk to the affected conductors which effectively cancels out any cross talk on the conductors. Such cancellation may not be complete.

Figure 7:
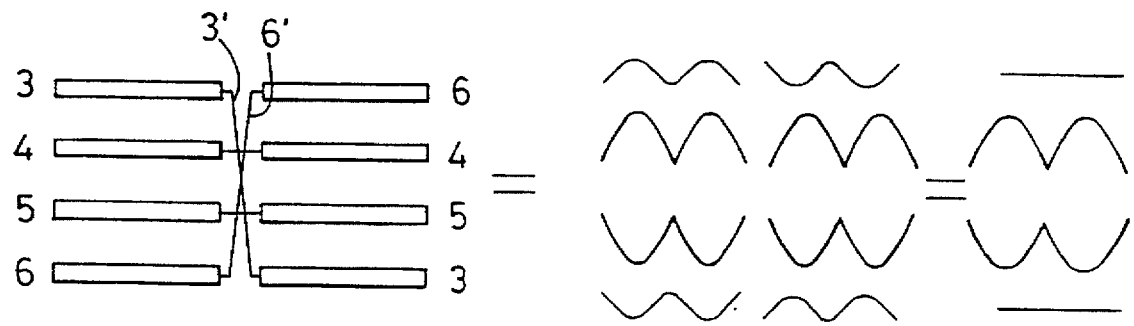
FIG. 7 illustrates a particular example of cross talk cancellation used for the arrangement of conductors of FIG. 4.

FIG. 7 shows the principle and theory in relation to pairs 1 and 2.

With reference to FIGS. 1 and 3, the antiphase cross talk is applied by a network of PCB tracking 36 to simulate the conductors. Conductors 3 and 6 are interchanged in position relative to conductors 4 and 5 as shown by the cross overs 3',6'. The effect of this change over is illustrated in the signal waveforms shown adjacent to the conductors. The interchange of conductors 3 and 6 can be readily achieved on the P.C.B. 40 by means of through-hole plating techniques and tracking on the opposite side of the P.C.B. as shown in FIG. 2 which illustrates the rear of P.C.B. 40. Tracks 402,404 provide the interconnections via through-holes 406,408 and 410,412. The arrangement is however exemplary and other configurations may be used.

The length, spacing and thickness of the PCB tracking 36 is crucial to the performance of the cross talk compensation circuit. Effectively, with close positioning of tracks, the same amount of capacitive coupling can be achieved in the tracking as in the connector fingers 32 which should provide enough antiphase cross talk to cancel the cross talk to acceptable levels. The selection of length spacing and thickness can be calculated theoretically for a given frequency range and then tested, and if necessary adjusted in a practical embodiment prior to finalisation of the dimensions.

Figure 8:
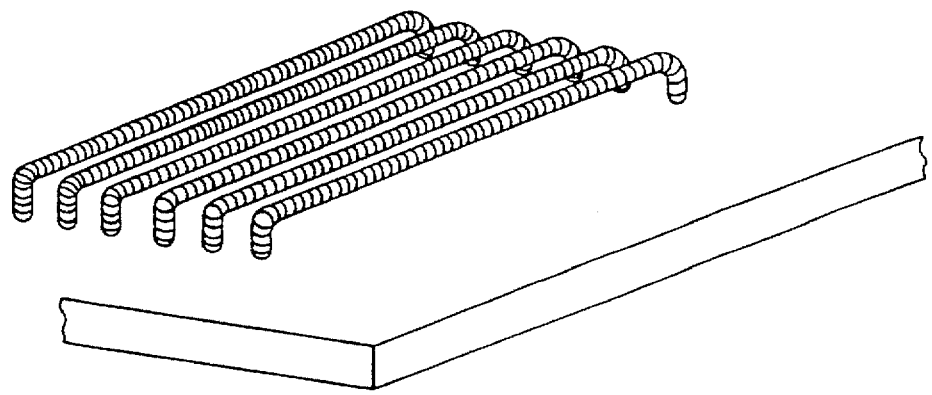
FIG. 8 shows an alternative cross talk cancellation system.

The compensation circuit used on the RJ45 socket as illustrated in FIGS. 1 to 3 was laid out on a PCB 40 for ease of production. However, it could have been replaced by wire links as shown in FIG. 8, but the basic principle of applying antiphase cross talk to the conductors is the same. The P.C.B. 40 can be mounted parallel to plug 24 (see FIG. 1) to achieve a flatter design of jack socket.

I claim:

1. Apparatus for reducing cross talk in a connector for a data communication system, the connector comprising a plurality of parallel fingers (32) for connection to a plug (20), characterized in that the means for reducing cross talk comprises additional path means (36) associate with and connected to at least two of the fingers (32) said additional path means comprising a cross over point providing a cross over of signals within the connector and in that the additional path means is dimensioned to provide effective cancellation of any cross talk generated within the connector, in which the additional path means comprises adjacent conductive tracks (36) on a printed circuit board (40), said tracks having a defined spacing (d), in which the additional path means comprises conductive wires positioned adjacent to each other with a defined spacing, and in which the spacing of the spacing of the conductive wires or tracks is selected in accordance also with their thickness and length to provide a defined capacitance therebetween said capacitance providing the required transfer of signal to effect the cross talk cancellation within the connector.

2. Apparatus as claimed in claim 1, in which the connector includes at least eight parallel fingers forming six conduction paths (1–8), through the connector and characterized in that a cross over is effected only between conductors 3 and 6 and that conductor path 1 and 2; 4 and 5; 7 and 8 are not provided with any cross overs.

3. Apparatus as claimed in claim 2 in which the connector comprises a compact unit and in which the unit has means for mounting the connector fingers, means for mounting a printed circuit board adjacent to the fingers and means for connecting the printed circuit board to the fingers and in which the printed circuit board includes through hole plating means for providing required cross overs of the conductor paths.

\* \* \* \* \*